United States Patent
Chen et al.

(10) Patent No.: US 10,452,591 B2
(45) Date of Patent: Oct. 22, 2019

(54) CIRCUIT FOR INHIBITING SINGLE-ENDED ANALOGUE SIGNAL NOISE, AND TERMINAL ATTACHMENT

(71) Applicant: HYTERA COMMUNICATIONS CORP., LTD., Shenzhen, Guangdong (CN)

(72) Inventors: Guohua Chen, Shenzhen (CN); Zhiqiang Chen, Shenzhen (CN)

(73) Assignee: HYTERA COMMUNICATIONS CORPORATION LIMITED, Guangdong (CN)

( * ) Notice: Subject to any disclaimer, the term of this patent is extended or adjusted under 35 U.S.C. 154(b) by 31 days.

(21) Appl. No.: 15/743,540

(22) PCT Filed: Jul. 10, 2015

(86) PCT No.: PCT/CN2015/083748
§ 371 (c)(1),
(2) Date: Jun. 13, 2018

(87) PCT Pub. No.: WO2017/008196
PCT Pub. Date: Jan. 19, 2017

(65) Prior Publication Data
US 2018/0276172 A1 Sep. 27, 2018

(51) Int. Cl.
*G06F 13/42* (2006.01)
*H01J 21/10* (2006.01)
(Continued)

(52) U.S. Cl.
CPC .............. *G06F 13/42* (2013.01); *H01J 21/10* (2013.01); *H03F 1/26* (2013.01); *H03F 3/187* (2013.01);
(Continued)

(58) Field of Classification Search
CPC ........ H03F 3/45475; H03F 3/187; H03F 1/26; H01J 21/10; H01J 2200/03; H01J 3/181; H01J 3/45; G06F 13/42; G05B 19/042
See application file for complete search history.

(56) References Cited

U.S. PATENT DOCUMENTS

2003/0035406 A1\* 2/2003 Fraser ............... H04M 1/72502
370/347
2004/0201510 A1 2/2004 Fensel et al.
(Continued)

FOREIGN PATENT DOCUMENTS

| CN | 102857754 A | 1/2013 |
| CN | 103353725 A | 10/2013 |
| CN | 204009460 U | 12/2014 |

OTHER PUBLICATIONS

Search Report and Written Opinion for International Application No. PCT/CN2015/083748 dated Sep. 24, 2015.
(Continued)

*Primary Examiner* — Jing-Yih Shyu
(74) *Attorney, Agent, or Firm* — Calfee, Halter & Griswold, LLP

(57) ABSTRACT

A circuit inhibits single-ended analogue signal noises and can be included in a terminal accessory. The circuit includes an input interface module, a differential amplification module, an analogue signal processing module, an isolation module and a control module, wherein the input interface module at least includes an analogue signal line and a digital signal line, the differential amplification module includes differential input ends and an output end; the analogue signal line and the digital signal line of the input interface module are respectively connected to the differential input ends of the differential amplification module, so that the analogue signal line and the digital signal line form a pseudo-differential pair, and the output end of the differential amplifica-
(Continued)

tion module is connected to the analogue signal processing module; the digital signal line is further connected to the isolation module, and the isolation module is further connected to the control module.

14 Claims, 2 Drawing Sheets

(51) Int. Cl.
      *H03F 1/26*       (2006.01)
      *H03F 3/187*      (2006.01)
      *H03F 3/45*       (2006.01)
      *G05B 19/042*     (2006.01)
      *H03F 3/181*      (2006.01)

(52) U.S. Cl.
     CPC ....... *H03F 3/45475* (2013.01); *G05B 19/042* (2013.01); *H03F 3/181* (2013.01); *H03F 3/45* (2013.01); *H03F 2200/03* (2013.01)

(56) References Cited

U.S. PATENT DOCUMENTS

| | | | |
|---|---|---|---|
| 2007/0154025 A1* | 7/2007 | Zhang | H03G 3/348 381/71.1 |
| 2010/0135504 A1* | 6/2010 | Almagro | H04R 1/083 381/71.1 |
| 2011/0068869 A1 | 3/2011 | Chao | |
| 2011/0150237 A1* | 6/2011 | Nagasue | H03F 3/187 381/94.1 |
| 2013/0049713 A1 | 1/2013 | Hoshi | |
| 2015/0325903 A1* | 11/2015 | Kaneko | H01P 7/10 333/134 |

OTHER PUBLICATIONS

International Preliminary Report on Patentability and Written Opinion for International Application No. PCT/CN2015/083748 dated Jan. 16, 2018.
International Search Report for International Application No. PCT/CN2015/083748 dated Sep. 24, 2015.

* cited by examiner

CIRCUIT FOR INHIBITING SINGLE-ENDED ANALOGUE SIGNAL NOISE, AND TERMINAL ATTACHMENT

TECHNICAL FIELD

The utility model relates to the field of communications, and more particularly, to a circuit for inhibiting single-ended analogue signal noises and a terminal accessory.

BACKGROUND

In circuit design, due to the change of market requirements, when the function needs to be expanded, an expansion module is usually added on the basis of the original circuit. The expansion module includes a data circuit, a wireless radiofrequency circuit, and other modules. At the moment, the original circuit is a host module, and the expanded module is an accessory module.

However, since a digital circuit module in a circuit of the expansion module forms a loop itself, a noise problem is easily caused in the long-line transmission or the digital-analog hybrid use of a single-ended analogue signal (the single-ended analogue signal is an analogue signal forming a loop with the ground), which will greatly interfere the ground and a power supply, thus resulting in the imbalance between a ground potential of the host module and a ground potential of the accessory module. It is equivalent to that the ground wire of the accessory module has a potential difference relative to the ground of the host module, and the potential difference can be deemed as noises. The reference potential of the original signal line is the ground wire of the host module, and when it is connected to the accessory module, it is subject to the ground wire of the accessory module. The signal line connected to the accessory module is no longer the original signal relative to the ground wire of the host module, but is superimposed with the noises of the accessory ground, and the noises are also amplified after the amplification processing, which affects the signal quality. The situation where the analogue signal line is interfered is especially apparent, and the signal is attenuated.

The current solutions are usually as follows: (1) filtering the analogue signal in the accessory module, and increasing the filtering by grounding capacitance; and (2) processing a power supply signal and a digital signal, such as isolation and filtering.

However, the current solutions have the following shortcomings: for the solution (1), it is relatively difficult to select the filtering capacitance. when the capacitance is too little, it is noneffective, and if the capacitance is too large, the signal will be affected; and for the solution (2), additional resource input is needed, and a circuit board needs to be enlarged, which has a relatively high cost.

SUMMARY

The utility model provides a circuit for inhibiting single-ended analogue signal noises and a terminal accessory, which can eliminate the noises introduced by transmitting a single-ended analogue signal and save the costs under the premise of not changing the original interface. In order to solve the technical problems above, the utility model adopts a technical solution as follows: a circuit for inhibiting single-ended analogue signal noises is provided, wherein the circuit is configured to connect a host, the circuit comprises an input interface module, a differential amplification module, an analogue signal processing module, an isolation module and a control module, wherein the differential amplification module comprises differential input ends and an output end; the input interface module is connected to the differential input ends of the differential amplification module through an analogue signal line and a digital signal line, and the output end of the differential amplification module is connected to the analogue signal processing module; wherein the analogue signal line is configured to transmit an analogue signal, the analogue signal is a single-ended analogue signal, and the single-end analogue signal is the analogue signal forming a loop with a ground signal; the digital signal line is configured to transmit a digital signal, and the digital signal is a control signal; the input interface module is connected to the isolation module through the digital signal line, and the isolation module is connected to the control module; the input interface module is configured to connect an interface module of the host; the differential amplification module is configured to differentially amplify the voltage difference of the differential input ends; and the analogue signal processing module is configured to process the signal outputted by the output end of the differential amplification module.

The working mode of the digital signal and the analogue signal is a simplex mode or a half-duplex mode.

The isolation module includes an input end, an output end and a control end, the input end is connected to the digital signal line, the output end is connected to a ground wire, and the control end is connected to the control module.

The differential amplification module comprises a differential amplifier, the differential amplifier includes a differential input end and an output end, the differential input end is connected to the analogue signal line and the digital signal line, and the output end is connected to the analogue signal processing module.

In order to solve the technical problems above, the utility model adopts another technical solution as follows: a circuit for inhibiting single-ended analogue signal noises is provided, wherein the circuit is configured to connect a host, the circuit comprises an input interface module, a differential amplification module, an analogue signal processing module, an isolation module and a control module, and the differential amplification module comprises differential input ends and an output end; the input interface module is connected to the differential input ends of the differential amplification module through an analogue signal line and a digital signal line, and the output end of the differential amplification module is connected to the analogue signal processing module; the input interface module is connected to the isolation module through the digital signal line, and the isolation module is connected to the control module; the input interface module is configured to connect an interface module of the host; the differential amplification module is configured to differentially amplify the voltage difference of the differential input ends of the differential amplification module; and the analogue signal processing module is configured to process the signal outputted by the output end of the differential amplification module.

The analogue signal line is configured to transmit an analogue signal, the analogue signal is a single-ended analogue signal, and the single-ended analogue signal is the analogue signal forming a loop with a ground signal.

The digital signal line is configured to transmit a digital signal, and the digital signal is a control signal.

The working mode of the digital signal transmitted by the digital signal line and the analogue signal transmitted by the analogue signal line is a simplex mode or a half-duplex mode.

The isolation module comprises an input end, an output end and a control end, the input end is connected to the digital signal line, the output end is connected to a ground wire, and the control end is connected to the control module.

The differential amplification module comprises a differential amplifier, the differential amplifier comprises a differential input end and an output end, the differential input end is connected to the analogue signal line and the digital signal line, and the output end is connected to the analogue signal processing module.

The isolation module comprises a transistor.

The transistor is a field-effect transistor, the field-effect transistor comprises a grid electrode, a source electrode and a drain electrode, the grid electrode is the control end, the source electrode is the input end, and the drain electrode is the output end.

The transistor is a triode, the triode comprises a base electrode, a collector electrode and an emitting electrode, the base electrode is the control end, the collector electrode is the input end, and the emitting electrode is the output end.

In order to solve the technical problems above, the utility model adopts one other technical solution as follows: a terminal accessory is provided, wherein the terminal accessory is configured to connect the terminal, and the terminal accessory comprises any one of the circuit for inhibiting single-ended analogue signal noises above.

In the solution above, the analogue signal line and the digital signal line led out from the host side are connected to the differential input ends of the differential amplification module, so that the analogue signal line and the digital signal line form a pseudo-differential pair. Since the analogue signal and the digital signal are both led out from the host, and the reference ground wires are both the ground wire of the host, the common-mode interference of the analogue signal received in the transmission process is inhibited by utilizing the differential characteristics of the differential amplifier; therefore, an interfered ground wire of the terminal accessory as a reference ground can be avoided, and noises at a ground potential of the terminal accessory and noises in the transmission process can be inhibited. The control module is isolated from the digital signal line through the isolation module, which can prevent a control signal of the digital signal line and a control signal of the control module from forming loop coupling noises.

DETAILED DESCRIPTION

In the following description, the specific details like a particular system structure, interfaces and technologies are proposed for illustration rather than limitation, so as to understand the utility model thoroughly.

Figure 1:
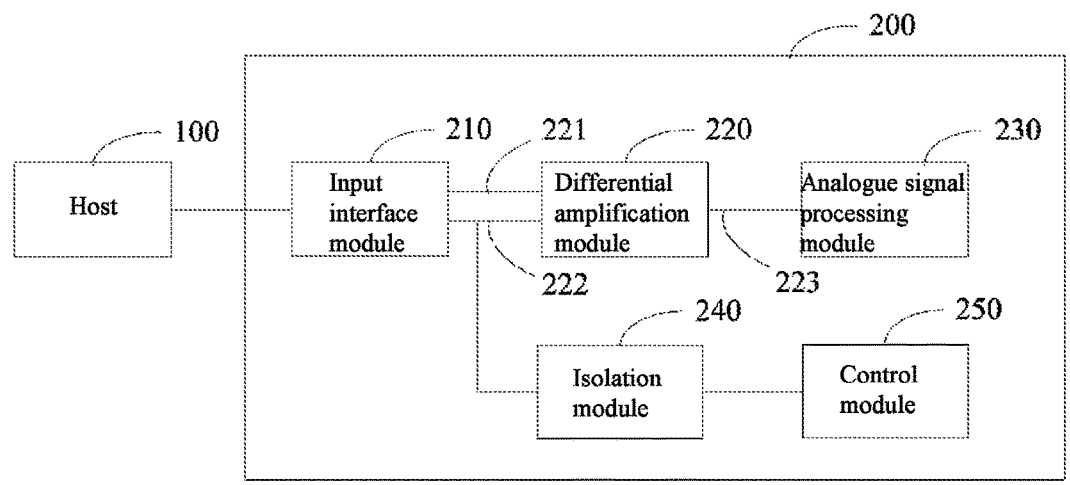
FIG. 1 is a structural schematic diagram of an embodiment of a circuit for inhibiting single-ended analogue signal noises according to the utility model.

Referring to FIG. 1. FIG. 1 is a structural schematic diagram of an embodiment of a circuit for inhibiting single-ended analogue signal noises according to the utility model.

A circuit 200 for inhibiting single-ended analogue signal noises in the utility model is configured to connect a host 100. The circuit 200 for inhibiting single-ended analogue signal noises comprises an input interface module 210, a differential amplification module 220, an analogue signal processing module 230, an isolation module 240 and a control module 250. The input interface module 210 at least comprises an analogue signal line and a digital signal line. The input interface module 210 can further comprise a ground wire and a power supply wire, and the differential amplification module 220 comprises differential input ends 221 and 222, and an output end 223.

The input interface module 210 is respectively connected to the differential input ends 221 and 222 of the differential amplification module 220 through the analogue signal line and the digital signal line, so that the analogue signal line and the digital signal line form a pseudo-differential pair, and the output end 223 of the differential amplification module 220 is connected to the analogue signal processing module 230. The digital signal line is further connected to the isolation module 240, and the isolation module 240 is further connected to the control module 250.

The input interface module 210 is configured to connect an interface module (not shown in the figure) of the host 100. The input interface module 210 and the interface module of the host 100 have the same signal lines. The analogue signal line is configured to transmit an analogue signal, and the digital signal line is configured to transmit a digital signal. The analogue signal is a single-ended analogue signal, and the single-end analogue signal is an analogue signal forming a loop with a ground signal, such as an audio signal, a voltage and current acquisition signal, etc. The digital signal is a digital signal with less signal changes during the transmission process. That is, less data is transmitted, such as an enable signal and other control signals.

The differential amplification module 220 is configured to differentially amplify the voltage difference of the differential input ends 221 and 222. The analogue signal processing module 230 is configured to process the signal outputted by the output end 223 of the differential amplification module 220.

The isolation module 240 is configured to isolate the control module 250 and the digital signal line to prevent the digital signal line and the control signal of the control module 250 from forming loop coupling noises.

Figure 2:
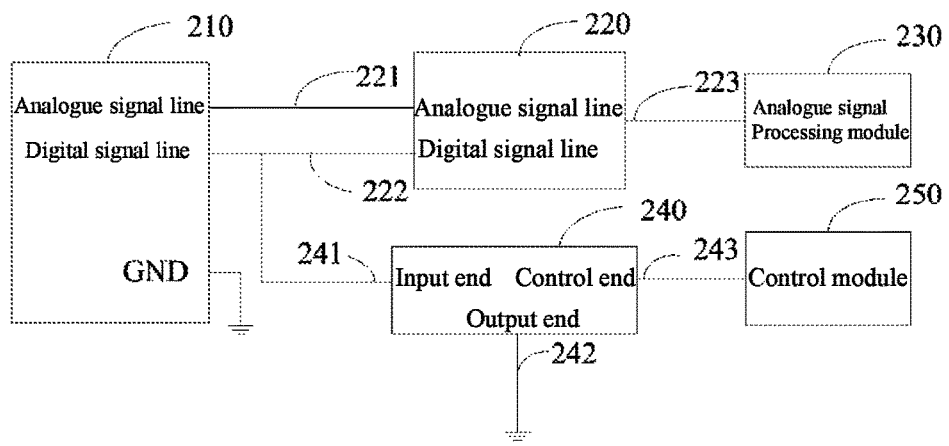
FIG. 2 is a circuit structure diagram of an embodiment of a circuit for inhibiting single-ended analogue signal noises according to the utility model.

In specific, FIG. 2 is a circuit structure diagram of an embodiment of a circuit for inhibiting single-ended analogue signal noises according to the utility model.

The circuit for inhibiting single-ended analogue signal noises comprises an input interface module 210, a differential amplification module 220, an analogue signal processing module 230, an isolation module 240 and a control module 250. The input interface module 210 at least comprises an analogue signal line, a digital signal line and a ground wire. It can be understood that when the circuit 200 for inhibiting single-ended analogue signal noises needs power supply, the input interface module 210 can further comprise a power supply wire. The differential amplification module 220 comprises differential input ends 221 and 222, and an output end 223. The differential amplification module 220 comprises a differential amplifier (not shown in the figure), the differential amplifier comprises differential input ends and an output end, the differential input ends of the differential amplifier are the differential input ends 221 and 222 of the differential amplification module 220, and the output end of the differential amplifier is the output end 223 of the differential amplification module 220. The isolation module 240 comprises an input end 241, an output end 242 and a control end 243.

The input interface module 210 is respectively connected to the differential input ends 221 and 222 of the differential amplification module 220 through an analogue signal line and a digital signal line, so that the analogue signal line and the digital signal line form a pseudo-differential pair. The output end 223 of the differential amplification module 220 is connected to the analogue signal processing module 230. The differential input end 221 may be a positive polarity differential input end, and the differential input end 222 may be a negative polarity differential input end; the differential input end 221 may also be a negative polarity differential input end, and the differential input end 222 may also be a positive polarity differential input end, which is not limited here.

The input interface module 210 is further connected to the input end 241 of the isolation module 240 through the digital signal line, the output end 242 of the isolation module 240 is connected to the ground wire, and the control end 243 of the isolation module 240 is connected to the control module 250.

The input interface module 210 is configured to connect an interface module (not shown in the figure) of the host 100. The input interface module 210 and the interface of the host 100 have the same signal lines. The analogue signal line is configured to transmit an analogue signal, and the digital signal line is configured to transmit a digital signal. The analogue signal is a single-ended analogue signal, and the single-end analogue signal is an analogue signal forming a loop with a ground signal, such as an audio signal, a voltage and current acquisition signal, etc. The digital signal is a digital signal with less signal change during the transmission process. That is, less data is transmitted, such as an enable signal and other control signals.

The differential amplification module 220 is configured to differentially amplify the voltage difference of the differential input ends 221 and 222. The analogue signal processing module 230 is configured to process the signal outputted by the output end 223 of the differential amplification module 220.

The isolation module 240 is configured to isolate the control module 250 and the digital signal line to prevent the digital signal line and the control signal of the control module 250 from forming loop coupling noises.

For example, the input interface module 210 includes but is not limited to a micro phone (Micro phone, MIC) signal line, a push to talk (Push to Talk, PTT) signal line, and a speaker (Speaker, SPK) signal line. When an terminal accessory composed of the circuit for inhibiting single-ended analogue signal noises needs to be expanded with more functions (such as a liquid-crystal display function and a wireless communication function), the input interface module may include other signal lines. The signal lines in the input interface module 210 are the same as the signal lines in the interface module of the host, so as to expand the function of the terminal accessory without changing the circuit of the host 100. The pseudo-differential pair formed by the analogue signals and the digital signals are selected according to the actual conditions specifically.

The MIC signal line is configured to input an audio signal; the PPT signal line is configured to transmit a control signal, and the control signal is triggered by a user through a key. The SPK signal line is configured to transmit the audio signal. The SPK signal and the PPT signal form the pseudo-differential pair, the SPK signal is an analogue signal, and the PPT signal is a digital signal. The working modes of the SPK signal and the PPT signal are simplex modes, that is, when transmitting the PPT signal, the receiving of the SPK signal can be disabled, and when receiving the SPK signal, the transmission of the PPT signal is disabled.

When transmitting the SPK signal, the control module 250 inputs the control signal to the control end 243 of the isolation module 240 to control the input end 241 and the output end 242 of the isolation module 240 to form a connection, so as to implement the transmission of the digital signal PPT. Meanwhile, the differential amplifier does not work, so as to prevent a data cable PPT from introducing noises.

When receiving the analogue signal SPK, the control module 250 inputs the control signal to the control end 243 of the isolation module 240 to control the input end 241 and the output end 242 of the isolation module 240 to disconnect from each other. After the SPK signal sent by the host 100 is transmitted to the differential amplifier 220 through the analogue signal line to conduct differential amplification, the SPK signal is transmitted back to the host 100 through the digital signal line, so that the SPK signal is connected to the ground wire of the host 100 by taking the digital signal line as the loop. The signal differentially amplified by the differential amplifier 220 is inputted to the analogue signal processing module 230 for further processing.

Since the SPK signal transmitted from the host 100 to the terminal accessory forms a loop with the digital signal line and returns to the host 100 after passing through the differential amplifier, and finally, the ground wire of the host 100 is used as reference, and the signal is not affected by the interfered ground wire of the terminal accessory. Thus, the condition that the ground potential of the terminal accessory is different from the ground potential of the host 100 can be prevented when transmitting the analogue signal. Inhibiting the common-mode interference received by the analogue signal and the digital signal in the transmission process by utilizing the differential characteristics of the differential amplifier can inhibit the noise interference of the ground potential of the terminal accessory to the analogue signal and the digital signal.

In the embodiment, the differential amplifier may either be an integrated differential amplifier, or a differential amplifier composed of two operational amplifiers, and may further be a differential amplifier composed of separated triode and/or MOS transistor, which is not limited here.

It can be understood that, in order to better inhibit the noises of the single-ended analogue signal, a capacitive value between the digital signal line of a high-frequency loop of the host 100 and the ground wire can be increased under the premise of not affecting the data transmission, thus providing an alternating current loop for the analogue signal, so as to reduce the noises introduced by the analogue signal.

According to the solution above, the analogue signal line and the digital signal line are connected to the differential input ends of the differential amplification module to enable the analogue signal line and the digital signal line to form the pseudo-differential pair, so that the analogue signal and the digital signal form a loop to be connected to the ground wire of the host. Because the analogue signal and the digital signal are both led out from the host, and both use the ground wire of the host as the reference ground wire thereof, and the differential characteristics of the differential amplifier are utilized to inhibit the common-mode interference of the analogue signal suffered in the transmission process, an interfered ground wire of the terminal accessory as the reference ground can be avoided, and noises at a ground potential of the terminal accessory and noises in the transmission process can be inhibited. The control module is isolated from the digital signal wire through the isolation module, which can prevent the digital signal wire and the control signal of the control module from forming loop coupling noises.

Figure 3:
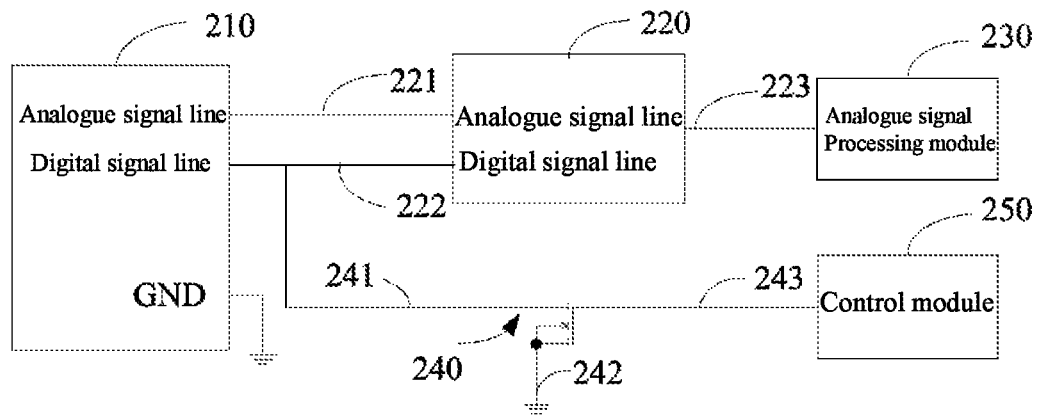
FIG. 3 is a circuit structure diagram of a transistor being a field-effect transistor in an isolation module of FIG. 2.

Referring to FIG. 3. FIG. 3 is a circuit structure diagram of a transistor being a field-effect transistor in the isolation module of FIG. 2.

As shown in FIG. 3, the isolation module 240 comprises a transistor, and the transistor is an N-type or P-type field-effect transistor. The field-effect transistor comprises a grid electrode g, a source electrode s and a drain electrode d. When the transistor is the N-type field-effect transistor, the grid electrode g is the control end 243, the source electrode s is the input end 241, and the drain electrode d is the output end 242. When the transistor is the P-type field-effect transistor, the grid electrode g is the control end 243, the source electrode s is the output end 242, and the drain electrode d is the input end 241.

The input interface module 210 at least comprising an MIC signal line, a PPT signal line and an SPK signal line is taken as example hereinafter, but the input interface module is not limited to this.

The MIC signal line is used for inputting an audio signal; the PPT signal line is used for transmitting a control signal, and the control signal is triggered by a user through a press key. The SPK signal line is configured to transmit the audio signal. The SPK signal and the PPT signal form the pseudo-differential pair, the SPK signal is the analogue signal, and the PPT signal is the digital signal. The working mode of the SPK signal and the PPT signal is a simplex mode. That is, when transmitting the PPT signal, the receiving of the SPK signal can be closed, and when receiving the SPK signal, the transmission of the PPT signal is closed.

When transmitting the PPT signal, the control module 250 inputs the control signal to the grid electrode 243 of the field-effect transistor 240 to control the field-effect transistor 240 to be connected, so that the source electrode 241 is connected to the drain electrode 242 to implement the transmission of the digital signal PPT. In the meantime, the differential amplifier does not work, so as to prevent a data cable PPT from introducing noises. When the field-effect transistor is the P-type field-effect transistor, the control signal inputted to the grid electrode 243 by the control module 250 is low level, so as to connect the P-type field-effect transistor; and when the field-effect transistor is the N-type field-effect transistor, the control signal inputted to the grid electrode 243 by the control module 250 is high level, so as to connect the N-type field-effect transistor.

When receiving the analogue signal SPK, the control module 250 inputs the control signal to the grid electrode 243 of the field-effect transistor 240, so as to control the cutting off of the field-effect transistor 240, so that the source electrode 241 is disconnected from the drain electrode 242. After the SPK signal sent by the host 100 is transmitted to the differential amplifier 220 through the analogue signal line to conduct differential amplification, the SPK signal is transmitted back to the host 100 through the digital signal line, so that the SPK signal is connected to the ground wire of the host 100 by using the digital signal line used as the loop. The signal differentially amplified by the differential amplifier 220 is inputted to the analogue signal processing module 230 for further processing. When the field-effect transistor is the P-type field-effect transistor, the control signal is high level, so as to cut off the P-type field-effect transistor; and when the field-effect transistor is the N-type field-effect transistor, the control signal is low level, so as to cut off the N-type field-effect transistor.

Since the SPK signal transmitted to the terminal accessory does not use the ground wire of the terminal accessory as the loop, the SPK signal transmitted to the terminal accessory from the host 100 forms a loop with the digital signal line and returns to the host 100 after passing through the differential amplifier, and finally, the ground wire of the host 100 is used as reference. Thus, the condition that the ground potential of the terminal accessory is different from the ground potential of the host 100 can be prevented when transmitting the analogue signal, thus inhibiting the interference of the ground wire of the terminal accessory to the analogue signal SPK.

In the embodiment, the differential amplifier may either be an integrated differential amplifier, or a differential amplifier composed of two operational amplifiers, and may further be a differential amplifier composed of separated triode and/or MOS transistor, which is not limited here.

It can be understood that, in order to better inhibit the noises of the single-ended analogue signal, a capacitive value between the digital signal line of a high-frequency loop of the host 100 and the ground wire can be increased under the premise of not affecting the data transmission, thus providing an alternating current loop for the analogue signal, so as to reduce the noises introduced by the analogue signal.

According to the solution above, the analogue signal line and the digital signal line are connected to the differential input ends of the differential amplification module to enable the analogue signal line and the digital signal line to form the pseudo-differential pair, so that the analogue signal and the digital signal form a loop to be connected to the ground wire of the host. Because the analogue signal and the digital signal are both led out from the host, and both use the ground wire of the host as the reference ground wire thereof, and the differential characteristics of the differential amplifier are utilized to inhibit the common-mode interference of the analogue signal suffered in the transmission process, an interfered ground wire of the terminal accessory as the reference ground can be avoided, and noises at a ground potential of the terminal accessory and noises in the transmission process can be inhibited. The control module is isolated from the digital signal wire through the isolation module, which can prevent the digital signal wire and the control signal of the control module from forming loop coupling noises.

Figure 4:
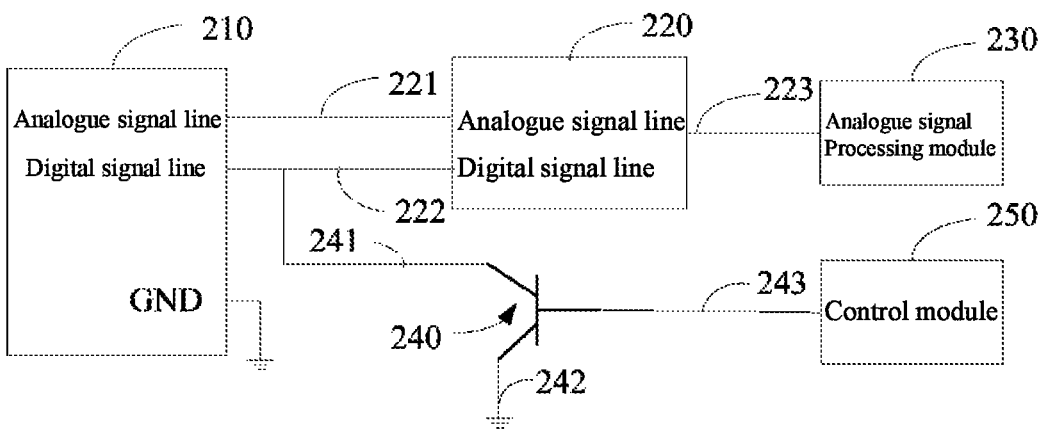
FIG. 4 is a circuit structure diagram of a transistor being a triode in an isolation module of FIG. 2.

Referring to FIG. 4. FIG. 4 is a circuit structure diagram of a transistor being a triode in the isolation module of FIG. 2.

As shown in FIG. 4, the isolation module 240 comprises a transistor, and the transistor is an N-type or P-type triode. The triode comprises a base electrode b, an emitting electrode c and a collector electrode e. When the transistor is the N-type triode, the base electrode b is the control end 243, the collector electrode c is the input end 241, and the emitting electrode e is the output end 242. When the transistor is the P-type triode, the base electrode b is the control end 243, the collector electrode c is the output end 242, and the emitting electrode e is the input end 241.

The input interface module 210 at least comprising an MIC signal line, a PPT signal line and an SPK signal line is taken as example hereinafter, but the input interface module is not limited to this.

The MIC signal line is configured to input an audio signal; the PPT signal line is configured to transmit a control signal, and the control signal is triggered by a user through a press key. The SPK signal line is configured to transmit the audio signal. The SPK signal and the PPT signal form the pseudo-differential pair, the SPK signal is the analogue signal, and the PPT signal is the digital signal. The working mode of the SPK signal and the PPT signal is a simplex mode. That is, when transmitting the PPT signal, the receiving of the SPK signal can be closed, and when receiving the SPK signal, the transmission of the PPT signal is closed.

When transmitting the PPT signal, the control module 250 inputs the control signal to the base electrode 243 of the triode 240 to control the triode 240 to be connected, so that the collector electrode 241 is connected to the emitting electrode 242 to implement the transmission of the digital signal PPT. In the meantime, the differential amplifier does not work, so as to prevent a data cable PPT from introducing noises. When the triode is the P-type triode, the control signal inputted to the base electrode by the control module 250 is low level, so as to connect the P-type triode; and when the triode is the N-type triode, the control signal inputted to the base electrode by the control module 250 is high level, so as to connect the N-type triode.

When receiving the analogue signal SPK, the control module 250 inputs the control signal to the base electrode 243 of the triode 240, so as to control the cutting off of the triode 240, so that the collecting electrode 241 is disconnected from the emitting electrode 242. After the SPK signal sent by the host 100 is transmitted to the differential amplifier 220 through the analogue signal line to conduct differential amplification, the SPK signal is transmitted back to the host 100 through the digital signal line, so that the SPK signal is connected to the ground wire of the host 100 by using the digital signal line used as the loop. The signal differentially amplified by the differential amplifier 220 is inputted to the analogue signal processing module 230 for further processing. When the triode is the P-type triode, the control signal is high level, so as to cut off the P-type triode; and when the field-effect transistor is the N-type triode, the control signal is low level, so as to cut off the N-type triode.

Since the SPK signal transmitted to the terminal accessory does not use the ground wire of the terminal accessory as the loop, the SPK signal transmitted to the terminal accessory from the host 100 forms a loop with the digital signal line and returns to the host 100 after passing through the differential amplifier, and finally, the ground wire of the host 100 is used as reference. Thus, the condition that the ground potential of the terminal accessory is different from the ground potential of the host 100 can be prevented when transmitting the analogue signal, therefore inhibiting the interference of the ground wire of the terminal accessory to the analogue signal SPK.

In the embodiment, the differential amplifier may either be an integrated differential amplifier, or a differential amplifier composed of two operational amplifiers, and may further be a differential amplifier composed of separated triode and/or MOS transistor, which is not limited here.

It can be understood that, in order to better inhibit the noises of the single-ended analogue signal, a capacitive value between the digital signal line of a high-frequency loop of the host and the ground wire can be increased under the premise of not affecting the data transmission, thus providing an alternating current loop for the analogue signal, so as to reduce the noises introduced by the analogue signal.

According to the solution above, the analogue signal line and the digital signal line are connected to the differential input ends of the differential amplification module to enable the analogue signal line and the digital signal line to form the pseudo-differential pair, so that the analogue signal and the digital signal form a loop to be connected to the ground wire of the host. Because the analogue signal and the digital signal are both led out from the host, and both use the ground wire of the host as the reference ground wire thereof, and the differential characteristics of the differential amplifier are utilized to inhibit the common-mode interference of the analogue signal suffered in the transmission process, an interfered ground wire of the terminal accessory as the reference ground can be avoided, and noises at a ground potential of the terminal accessory and noises in the transmission process can be inhibited. The control module is isolated from the digital signal wire through the isolation module, which can prevent the digital signal wire and the control signal of the control module from forming loop coupling noises.

The utility model further provides a terminal accessory, wherein the terminal accessory comprises the circuit for inhibiting single-ended analogue signal noises according to any one of the embodiments above. Related descriptions in the embodiments can be referred from above for the details, and unnecessary details are not given here. The terminal accessory may be an audio accessory of a two-way radio, a Bluetooth headset, etc. The terminal accessory may also be expanded with a liquid-crystal display function, a wireless communication function, and other functions, which is not limited here.

In the above descriptions, the specific details like a particular system structure, interfaces and technologies are proposed for illustration rather than limitation, so as to understand the utility model thoroughly. However, those skilled in the art shall be clear that the utility model can also be implemented in other embodiments without the specific details. In other cases, the detailed descriptions of well-known device, circuit and method are omitted, so that the unnecessary details do not obstruct the descriptions to the utility model.

The invention claimed is:

1. A circuit for inhibiting single-ended analogue signal noises, wherein the circuit is used for connecting a host, the circuit comprises an input interface module, a differential amplification module, an analogue signal processing module, an isolation module and a control module, wherein the differential amplification module comprises differential input ends and an output end;

the input interface module is respectively connected to the differential input ends of the differential amplification module through an analogue signal line and a digital signal line, and the output end of the differential amplification module is connected to the analogue signal processing module; wherein the analogue signal line is used for transmitting an analogue signal, the analogue signal is a single-ended analogue signal, and the single-end analogue signal is the analogue signal forming a loop with a ground signal; the digital signal line is used for transmitting a digital signal, and the digital signal is a control signal;

the input interface module is connected to the isolation module through the digital signal line, and the isolation module is connected to the control module;

the input interface module is configured to connect an interface module of the host;

the differential amplification module is configured to differentially amplify a voltage difference of the differential input ends; and the analogue signal processing module is configured to process the analogue signal outputted by the output end of the differential amplification module.

2. The circuit according to claim 1, wherein a working mode of the digital signal and the analogue signal is a simplex mode or a half-duplex mode.

3. The circuit according to claim 1, wherein the isolation module comprises an input end, an output end and a control end, the input end is connected to the digital signal line, the output end is connected to a ground wire, and the control end is connected to the control module.

4. The circuit according to claim 1, wherein the differential amplification module comprises a differential amplifier, the differential amplifier comprises a differential input end and an output end, the differential input end is connected to the analogue signal line and the digital signal line, and the output end is connected to the analogue signal processing module.

5. A circuit for inhibiting single-ended analogue signal noises, wherein the circuit is used for connecting a host, the circuit comprises an input interface module, a differential amplification module, an analogue signal processing module, an isolation module and a control module, and the differential amplification module comprises differential input ends and an output end;

the input interface module is connected to the differential input ends of the differential amplification module through an analogue signal line and a digital signal line, and the output end of the differential amplification module is connected to the analogue signal processing module;

the input interface module is connected to the isolation module through the digital signal line, and the isolation module is connected to the control module;

the input interface module is used for connecting an interface module of the host;

the differential amplification module is used for differentially amplifying a voltage difference of the differential input ends of the differential amplification module; and the analogue signal processing module is used for processing the analogue signal outputted by the output end of the differential amplification module.

6. The circuit according to claim 5, wherein the analogue signal line is used for transmitting an analogue signal, the analogue signal is a single-ended analogue signal, and the single-ended analogue signal is the analogue signal forming a loop with a ground signal.

7. The circuit according to claim 5, wherein the digital signal line is configured to transmit a digital signal, and the digital signal is a control signal.

8. The circuit according to claim 5, wherein a working mode of the digital signal transmitted by the digital signal line and the analogue signal transmitted by the analogue signal line is a simplex mode or a half-duplex mode.

9. The circuit according to claim 5, wherein the isolation module comprises an input end, an output end and a control end, the input end is connected to the digital signal line, the output end is connected to a ground wire, and the control end is connected to the control module.

10. The circuit according to claim 5, wherein the differential amplification module comprises a differential amplifier, the differential amplifier comprises a differential input end and an output end, the differential input end is connected to the analogue signal line and the digital signal line, and the output end is connected to the analogue signal processing module.

11. The circuit according to claim 9, wherein the isolation module comprises a transistor.

12. The circuit according to claim 11, wherein the transistor is a field-effect tubctransistor, the field-effect tubctransistor comprises a grid electrode, a source electrode and a drain electrode, the grid electrode is the control end, the source electrode is the input end, and the drain electrode is the output end.

13. The circuit according to claim 11, wherein the transistor comprises a base electrode, a collector electrode and an emitting electrode, the base electrode is the control end, the collector electrode is the input end, and the emitting electrode is the output end.

14. A terminal accessory, wherein the terminal accessory is configured to connect a terminal to the host, and the terminal accessory comprises the circuit for inhibiting single-ended analogue signal noises according to claim 5.

* * * * *